United States Patent
Yuan et al.

(10) Patent No.: US 9,653,987 B2
(45) Date of Patent: May 16, 2017

(54) METHOD FOR DETECTING FAILURE OF SOFT START AND VARIABLE FREQUENCY DEVICE

(71) Applicant: DELTA ELECTRONICS, INC., Taoyuan (TW)

(72) Inventors: Te-Wei Yuan, Taoyuan (TW); Yu-Ling Lee, Taoyuan (TW); Yi-Kai Chou, Taoyuan (TW); Bo-Jheng Lin, Taoyuan (TW)

(73) Assignee: Delta Electronics, Inc., Taoyuan (TW)

(*) Notice: Subject to any disclaimer, the term of this patent is extended or adjusted under 35 U.S.C. 154(b) by 0 days.

(21) Appl. No.: 14/995,722

(22) Filed: Jan. 14, 2016

(65) Prior Publication Data
US 2016/0359422 A1   Dec. 8, 2016

(30) Foreign Application Priority Data
Jun. 3, 2015   (TW) ............................ 104117920 A

(51) Int. Cl.
| | |
|---|---|
| *H02M 1/36* | (2007.01) |
| *H02M 1/32* | (2007.01) |
| *H02M 5/42* | (2006.01) |
| *H02H 7/122* | (2006.01) |
| *H02H 3/05* | (2006.01) |
| *H02H 9/00* | (2006.01) |

(52) U.S. Cl.
CPC ............ *H02M 1/36* (2013.01); *H02H 7/122* (2013.01); *H02M 1/32* (2013.01); *H02M 5/42* (2013.01); *H02H 3/05* (2013.01); *H02H 9/002* (2013.01)

(58) Field of Classification Search
CPC ............ H02M 1/32; H02M 1/36; H02M 5/42; H02M 5/453; H02H 7/122; H02H 9/002
See application file for complete search history.

(56) References Cited

U.S. PATENT DOCUMENTS

| | | | | |
|---|---|---|---|---|
| 2004/0095784 | A1* | 5/2004 | Zhou | H02M 5/458 363/37 |
| 2015/0365019 | A1* | 12/2015 | Yamamoto | H02P 1/022 318/490 |
| 2016/0056750 | A1* | 2/2016 | West | H02P 29/021 318/490 |
| 2016/0072403 | A1* | 3/2016 | Niwa | G01R 31/40 363/89 |
| 2016/0268797 | A1* | 9/2016 | Li | H02M 5/4585 |
| 2016/0327998 | A1* | 11/2016 | Webster | H02M 1/15 |

* cited by examiner

*Primary Examiner* — Fred E Finch, III
(74) *Attorney, Agent, or Firm* — Muncy, Geissler, Olds & Lowe, P.C.

(57) ABSTRACT

A method for detecting failure of soft start includes: connecting a variable frequency device to a load; detecting an energy storage unit at a first voltage level; generating an output current to the load; detecting the energy storage unit changed from the first voltage level into a second voltage level; generating a reference voltage value according to the output current and determining whether a voltage difference value between the first voltage level and the second voltage level is larger than the reference voltage value; determining whether a voltage peak-to-peak value of the energy storage unit is smaller than a set value by the controller if the voltage difference value is larger than the reference voltage value; and controlling the inverter circuit to stop outputting the output current to the load if the voltage peak-to-peak value is smaller than the set value.

9 Claims, 5 Drawing Sheets

METHOD FOR DETECTING FAILURE OF SOFT START AND VARIABLE FREQUENCY DEVICE

CROSS REFERENCE TO RELATED APPLICATIONS

This Non-provisional application claims priority under 35 U.S.C. §119(a) on Patent Application No(s). 104117920 filed in Taiwan, Republic of China on Jun. 3, 2015, the entire contents of which are hereby incorporated by reference.

BACKGROUND

Technical Field

The invention relates to a method for detecting failure of soft start and a variable frequency device.

Related Art

Motor is an electrical device which can convert electrical power into mechanical power so as to drive other devices. Motors can be applied to for example industry huge motor, home fan motor, even or small or mini motor for mobile device, etc. Motor promotes the progress of technology and it is really convenient.

However, in the energy conversion of the motor, because partial electrical energy is converted into heat and consumed, the resulted mechanical energy is less and thus the conversion efficiency of energy is lowered. Thus, some industries utilize the inverter to drive the motor to adjust the frequency and amplitude of operating voltage so as to control the revolution and torque of the motor to improve conversion efficiency of power.

The inverter contains a soft start device and utilizes the resistor and the relay for soft start to prevent the elements from the damage due to the surge current generated by the input voltage. But when the soft start device fails and outputting to a load still continues, the resistor for soft start may easily catch fire due to overly high temperature.

SUMMARY

A method for detecting failure of soft start according to the invention is applied to a variable frequency device having an energy storage unit, an inverter circuit and a controller. The method includes: connecting the variable frequency device to a load; detecting the energy storage unit at a first voltage level by the controller; generating an output current to the load by the inverter circuit; detecting the energy storage unit changed from the first voltage level into a second voltage level by the controller; generating a reference voltage value according to the output current and determining whether a voltage difference value between the first voltage level and the second voltage level is larger than the reference voltage value by the controller; determining whether a voltage peak-to-peak value of the energy storage unit is smaller than a set value by the controller if the voltage difference value is larger than the reference voltage value; and controlling the inverter circuit by the controller to stop outputting the output current to the load if the voltage peak-to-peak value is smaller than the set value.

In one embodiment, the reference voltage value is generated according to the output current and a resistance of a soft start circuit of the variable frequency device.

A variable frequency device according to the invention includes a conversion circuit, a soft start circuit, an energy storage unit, an inverter circuit and a controller. The conversion circuit receives a power signal to accordingly output a DC signal. The soft start circuit receives the DC signal. The energy storage unit is electrically connected to the soft start circuit, the DC signal charges the energy storage unit to a first voltage level through the soft start circuit. The inverter circuit is electrically connected to the soft start circuit and the energy storage unit. The controller controls the inverter circuit to output an output current. When the inverter circuit generates the output current to a load, the energy storage unit is changed from the first voltage level into a second voltage level, the controller generates a reference voltage value according to the output current and determines whether a voltage difference value between the first voltage level and the second voltage level is larger than the reference voltage value. If the voltage difference value is larger than the reference voltage value, the controller determines whether a voltage peak-to-peak value of the energy storage unit is smaller than a set value. If the voltage peak-to-peak value is smaller than the set value, the inverter circuit stops outputting the output current to the load.

In one embodiment, the power signal is a DC power signal or an AC power signal.

In one embodiment, the conversion circuit is a bridge rectifier or a three-phase rectifier.

In one embodiment, the soft start circuit includes a resistor and a relay. On terminal of the resistor is electrically connected to both one terminal of the relay and the conversion circuit, and the other terminal of the resistor is electrically connected to both the other terminal of the relay and the energy storage unit.

In one embodiment, the soft start circuit includes a resistor and a thyristor. One terminal of the resistor is electrically connected to both one terminal of the thyristor and the conversion circuit, and the other terminal of the resistor is electrically connected to both the other terminal of the thyristor and the energy storage unit.

In one embodiment, the energy storage unit includes at least one capacitor.

In one embodiment, the inverter circuit is a half-bridge inverter, a full-bridge inverter, or a three-phase inverter.

As mentioned above, benefited from the detection and computation by the controller, it is possible to determine whether the soft start circuit fails and the variable frequency device V can accordingly stop operating so as to prevent the resistor from burnout due to overly high temperature even fire outbreak. Besides, in the embodiment, it is no necessary to install additional components on the variable frequency device but whether the soft start circuit fails still can be detected. Thus, no additional expense will be added into the product cost and product protection is enhanced.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1:
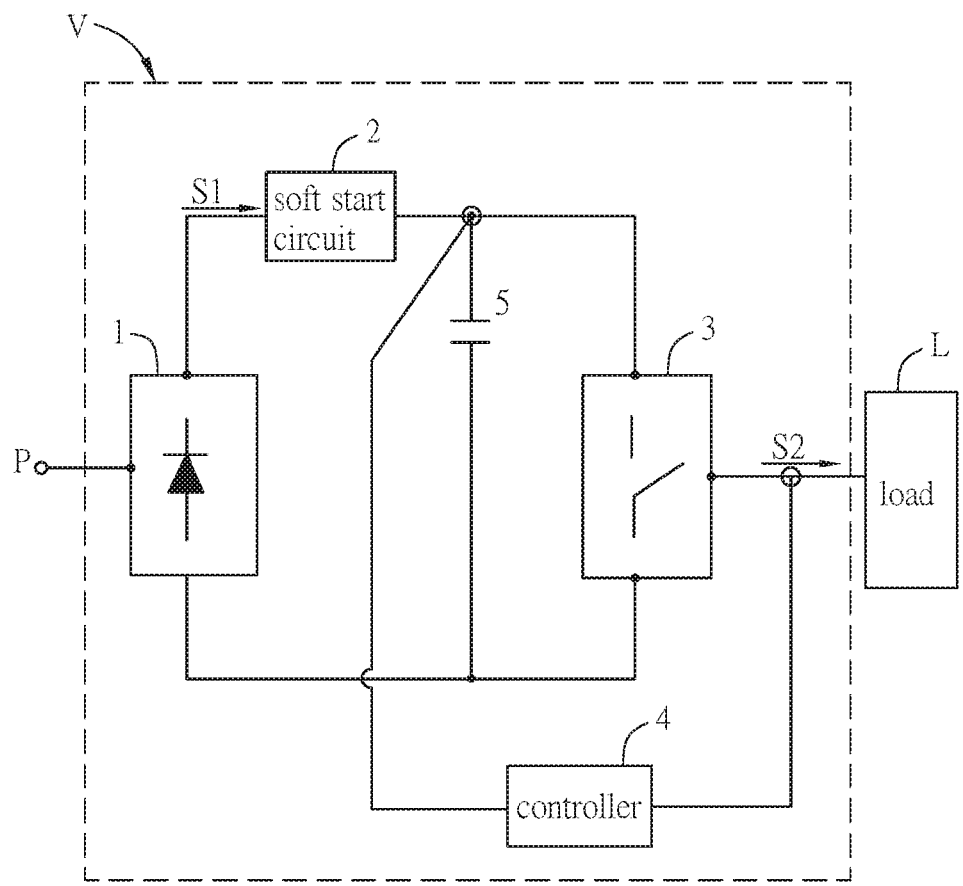
FIG. 1 is a schematic diagram showing the circuit of the variable frequency device according to the embodiment of the invention.

FIG. 1 is a schematic diagram showing the circuit of the variable frequency device according to the embodiment of the invention. Referring to FIG. 1, the variable frequency device V can be applied to a load L (for example a motor), and it includes a conversion circuit 1, a soft start circuit 2, an inverter circuit 3, a controller 4 and an energy storage unit 5. The conversion circuit 1 is electrically connected to the soft start circuit 2, the soft start circuit 2 is electrically connected to the inverter circuit 3 and the energy storage unit 5, and the controller 4 is coupled to the energy storage unit 5 and the inverter circuit 3.

The conversion circuit 1 receives a power signal P to accordingly output a DC signal S1. In the embodiment, the conversion circuit 1 is a bridge rectifier, and the power signal P is AC power signal which can be rectified to output as the DC signal S1 by the conversion circuit 1. Besides, the conversion circuit 1 can be a three-phase rectifier or other rectifier circuits, and it is not limited thereto.

The soft start circuit 2 receives the DC signal S1 to perform soft start. The DC signal S1 charges the energy storage unit 5 to a first voltage level V1 (shown in FIG. 3A) through the soft start circuit 2.

In the embodiment, the energy storage unit 5 is a capacitor for example. In other embodiments, the energy storage unit 5 may be a combination of multiple capacitors for example in series or in parallel which forms an equivalent capacitor. Here, the capacitor can be charged to the first voltage level V1 so as to provide a steady input voltage for the inverter circuit 3.

Figure 2A:
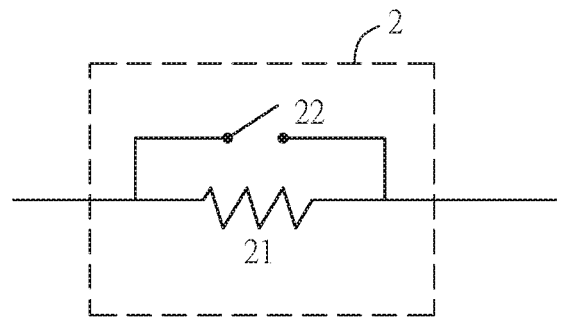
FIG. 2A is a schematic diagram showing the soft start circuit.

Referring to FIG. 1 and FIG. 2A, FIG. 2A is a schematic diagram of the soft start circuit. In the embodiment, the soft start circuit 2 includes a resistor 21 and a relay 22. One terminal of the resistor 21 is electrically connected to both one terminal of the relay 22 and the conversion circuit 1, and the other terminal of the resistor 21 is electrically connected to both the other terminal of the relay 22 and the energy storage unit 5, In other words, the resistor 21 and the relay 22 are electrically connected in parallel first and then they are connected between the conversion circuit 1 and the energy storage unit 5 in series. It is noted that the resistor 21 may be a combination of multiple resistors for example in series or in parallel which forms an equivalent resistor. Here, the resistor 21 has a resistance R so that the DC signal S1 passing through the resistor 21 causes a voltage drop and a surge current will not be generated to the energy storage unit 5.

Figure 2B:
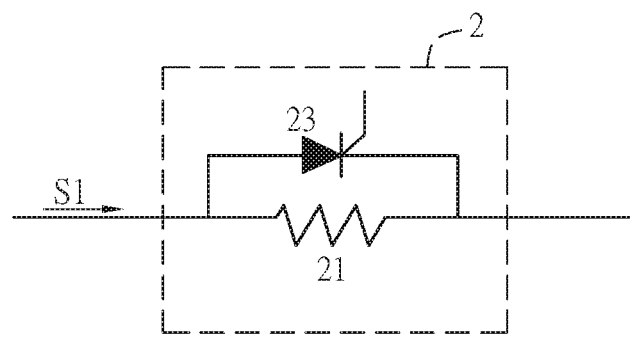
FIG. 2B is another schematic diagram showing the soft start circuit.

It is noted that in some embodiments as shown in FIG. 2B, the relay 22 can be replaced by a thyristor 23. Its anode terminal is electrically connected to the conversion circuit 1, its cathode terminal is electrically connected to the energy storage unit 5, and its control terminal is coupled to the controller 4.

The inverter circuit 3 is electrically connected to the soft start circuit 2 and the energy storage unit 5, and transforms the DC signal S1 into AC power signal to output an output current S2 to the load L. The inverter circuit 3 may be a half-bridge inverter, a full-bridge inverter, or a three-phase inverter.

The controller 4 is coupled to the energy storage unit 5 and the output terminal of the inverter circuit 3 to measure the voltage of the energy storage unit 5 and the output current of the inverter circuit 3 (namely the current value of the output current S2) so as to accordingly determine whether the soft start circuit 2 fails. At the moment, the controller 4 can control the inverter circuit 3 to output the output current S2. Moreover, the controller 4 may be for example a micro-processor, a MCU (micro control unit), a FPGA (field programmable gate array), a CPLD (complex programmable logic device), or an ASIC (application-specific integrated circuit), and it is not limited thereto.

Figure 3A:
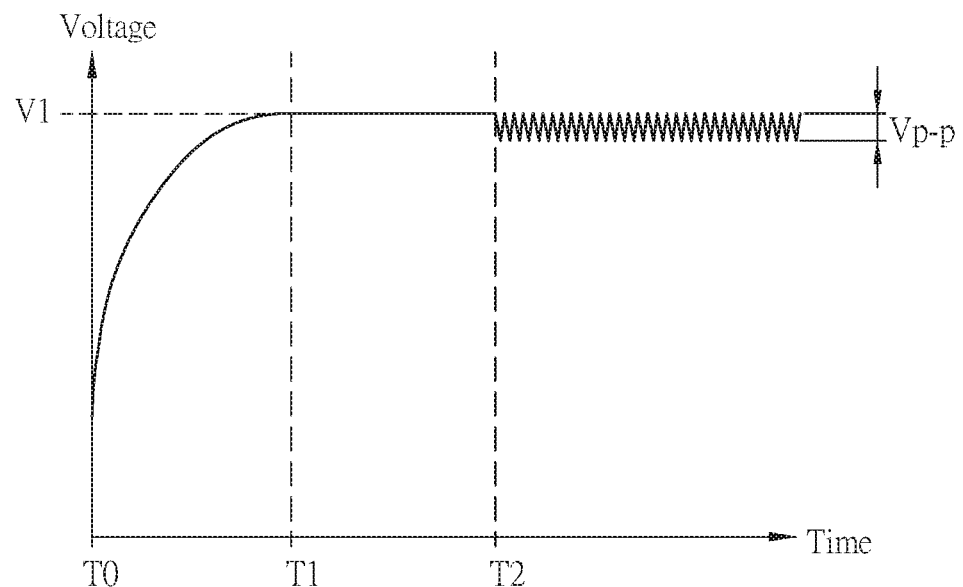
FIG. 3A is a voltage timing diagram of the energy storage unit when the soft start circuit is in regular operation.

Referring to FIG. 1, FIG. 2A and FIG. 3A, FIG. 3A is a voltage timing diagram of the energy storage unit when the soft start circuit is in regular operation. Furthermore, when the variable frequency device V is coupled to the power signal P (the initial stage of the operation, the initial time point T0), the relay 22 keeps disconnected so that the DC signal S1 would pass through the resistor 21 to the energy storage unit 5. Because the resistor 21 can prevent the circuit from the damage due to suddenly receiving surge current, it can protect the circuit elements. Then, when the controller 4 detects that the energy storage unit 5 has been charged completely to the first voltage level V1 (the first time point T1), the controller 4 can control the relay 22 to be conductible and enable the inverter circuit 3 to begin operation (the second time point T2). Therefore, the DC signal S1 will change its path to flow through the relay 22 to the inverter circuit 3 so as to generate the output current S2 to the load L. At the same time, because the energy storage unit 5 continuously charge and discharge, the controller 4 can detect that the voltage waveform of the energy storage unit 5 is like a slight ripple or serrated shape. At the moment, the energy storage unit 5 has a voltage peak-to-peak value Vp-p.

Figure 3B:
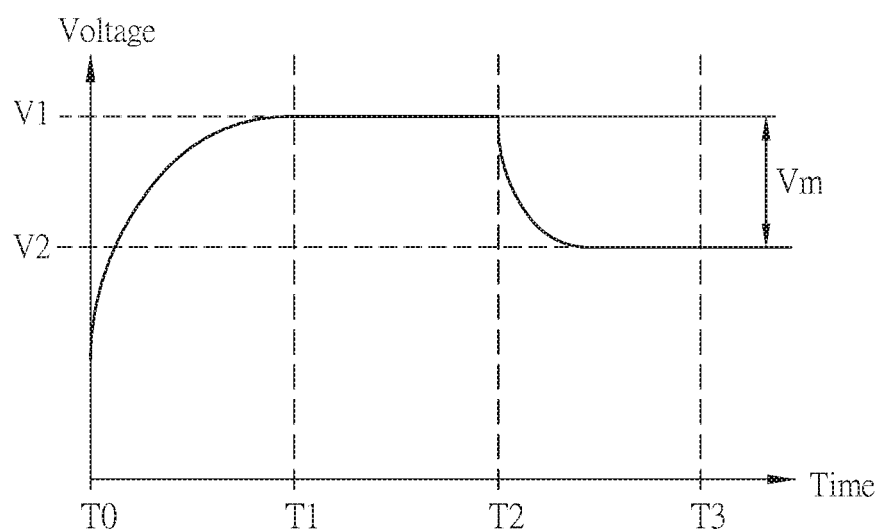
FIG. 3B is a voltage timing diagram of the energy storage unit when the soft start circuit fails.

Referring to FIG. 3B, FIG. 3B is a voltage timing diagram of the energy storage unit when the soft start circuit fails. When the relay 22 keeps disconnected and not conductible due to failure or damage, the DC signal S1 only passes through the resistor 21 and the controller 4 detects that the energy storage unit 5 has been charged completely to the first voltage level V1 (the first time point T1). The inverter circuit 3 is still accordingly enabled to begin operation (the second time point T2) to generate the output current S2 to the load L. At the moment, because the DC signal S1 causes a voltage drop while passing through the resistor 21, the controller 4 detects that the voltage of the energy storage unit 5 gradually becomes a second voltage level V2. Then, if the controller 4 detects that the voltage of the energy storage unit 5 is the second voltage level V2 (the third time point T3), the controller 4 generates a reference voltage value Vr according to the output current S2. In particular, it generates the reference voltage value Vr according to the current value of the output current S2 and the resistance of the soft start circuit 2 (namely the resistance R of the resistor 21). The product of the current value of the output current S2 and the resistance of the soft start circuit 2 is further multiplied by a correction coefficient C to obtain the reference voltage value Vr (Vr=current value of S2×R×C). It is noted that because the current value of the output current S2 varies depending on the distinct load L, the reference voltage value Vr is not a constant default value but a reference value which is fluctuated according to the variation of the output current S2. Therefore, the variable frequency device V just can generate the corresponding adequate reference voltage value Vr according to the distinct load L so as to accurately determine whether the soft start circuit 2 fails (described later), Then, the controller 4 determines whether a voltage difference value Vm between the first voltage level V1 and the second voltage level V2 is larger than the reference voltage value Vr. If true, the voltage difference of the energy storage unit 5 is overly large, and the controller 4 then determines the voltage peak-to-peak value Vp-p of the energy storage unit 5 is smaller than a set value. If smaller than the set value, it means that the energy storage unit 5 has a tiny ripple or serrated shape, namely the energy storage unit 5 has not been charged to the first voltage level V1 due to the voltage drop and it is still continuously being charged. It is noted that although sometimes the soft start circuit 2 does not fail, the voltage difference value Vm still may be overly large due to the larger load L. Therefore, it may be necessary to further determine whether the voltage peak-to-peak value Vp-p of the energy storage unit 5 is smaller than the set value. If the soft start circuit 2 does not fail, the voltage peak-to-peak value Vp-p will be larger. Thus, that the soft start circuit 2 actually fails can be confirmed by determining whether the voltage peak-to-peak value Vp-p is smaller than the set value to, and the set value may be appropriately chosen by actual design. Thus, the controller 4 can deduce that the relay 22 malfunctions on the basis of the two previous determinations. Accordingly, the controller 4 would control the inverter circuit 3 to stop outputting the output current S2 to the load L so as to prevent the resistor 21 from burnout due to overly high temperature even fire outbreak.

In addition, the conversion circuit 1 may be further coupled to the power signal P through a switch (not shown in the figure). If the controller 4 determines that the soft start circuit 2 has failed, the controller 4 can further control the switch to disconnect so that the conversion circuit 1 stops receiving the power signal P.

Therefore, in the embodiment, benefited from the detection and computation by the controller 4, it is possible to determine whether the soft start circuit 2 fails and the variable frequency device V can accordingly stop operating so as to prevent the resistor 21 from burnout due to overly high temperature even fire outbreak. Besides, in the embodiment, it is no necessary to install additional components on the variable frequency device V but whether the soft start circuit 2 fails still can be detected. Thus, no additional expense will be added into the product cost and product protection is enhanced.

Figure 4:
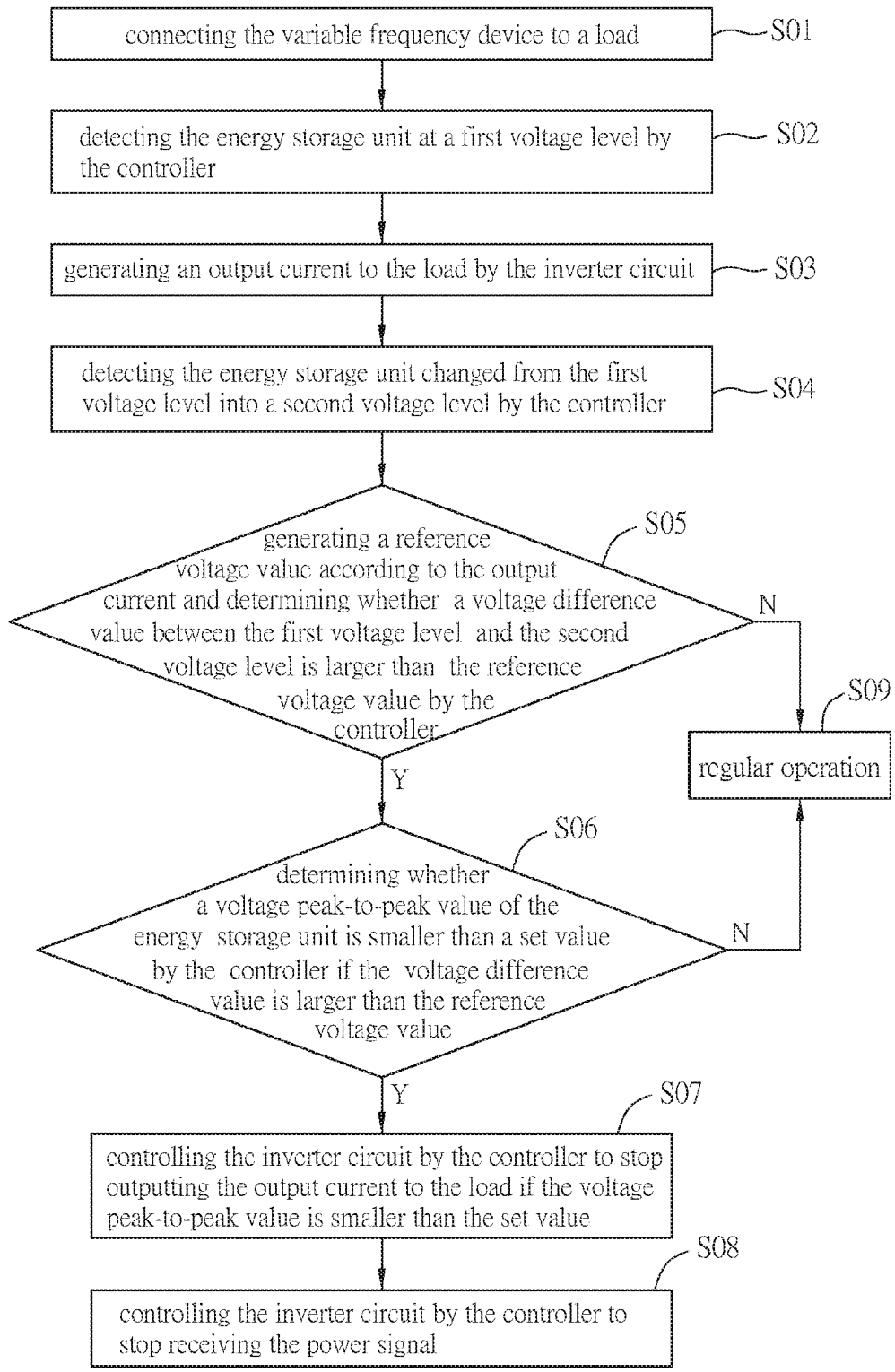
FIG. 4 is a flow chart showing the method for detecting failure of soft start according to the embodiment of the invention.

FIG. 4 is a flow chart showing the method for detecting failure of soft start according to the embodiment of the invention. Referring to FIG. to FIG. 4, the method is applied to and cooperates with the variable frequency device V mentioned above. Because the element configuration and operation are descripted above, they are not repeated here. Here, the method includes: connecting the variable frequency device to a load (S01); detecting the energy storage unit at a first voltage level by the controller (S02); generating an output current to the load by the inverter circuit (S03); detecting the energy storage unit changed from the first voltage level into a second voltage level by the controller (S04); generating a reference voltage value according to the output current and determining whether a voltage difference value between the first voltage level and the second voltage level is larger than the reference voltage value by the controller (S05); if the voltage difference value is larger than the reference voltage value, determining whether a voltage peak-to-peak value of the energy storage unit is smaller than a set value by the controller (S06); if the voltage peak-to-peak value is smaller than the set value, controlling the inverter circuit by the controller to stop outputting the output current to the load (S07).

In step S02 and step S04, the controller 4 can detect that the voltage variation of the energy storage unit 5 before and after the inverter outputs the current to the load. In step S03, when the inverter circuit 3 supplies power to the load L, the energy storage unit 5 begins to discharge. The controller 4 can detect that the current value of the output current S2 of the inverter circuit 3, namely the value of the output current of the variable frequency device V.

Then in step S05, the controller 4 is utilized to compare the difference value of the voltage variation of the energy storage unit 5 with the reference voltage value and accordingly determine whether the soft start circuit 2 possibly fails. Then in step S06, it determines whether the voltage peak-to-peak value Vp-p of the energy storage unit 5 is smaller than the set value. If smaller than the set value, the variable frequency device V is stopped operating to prevent the soft start circuit 2 from burn. Otherwise, the variable frequency device V keeps regular operation (S09). In some embodiments, the controller 4 can controls the conversion circuit 1 stop receiving the power signal P (S08).

Figure 5:
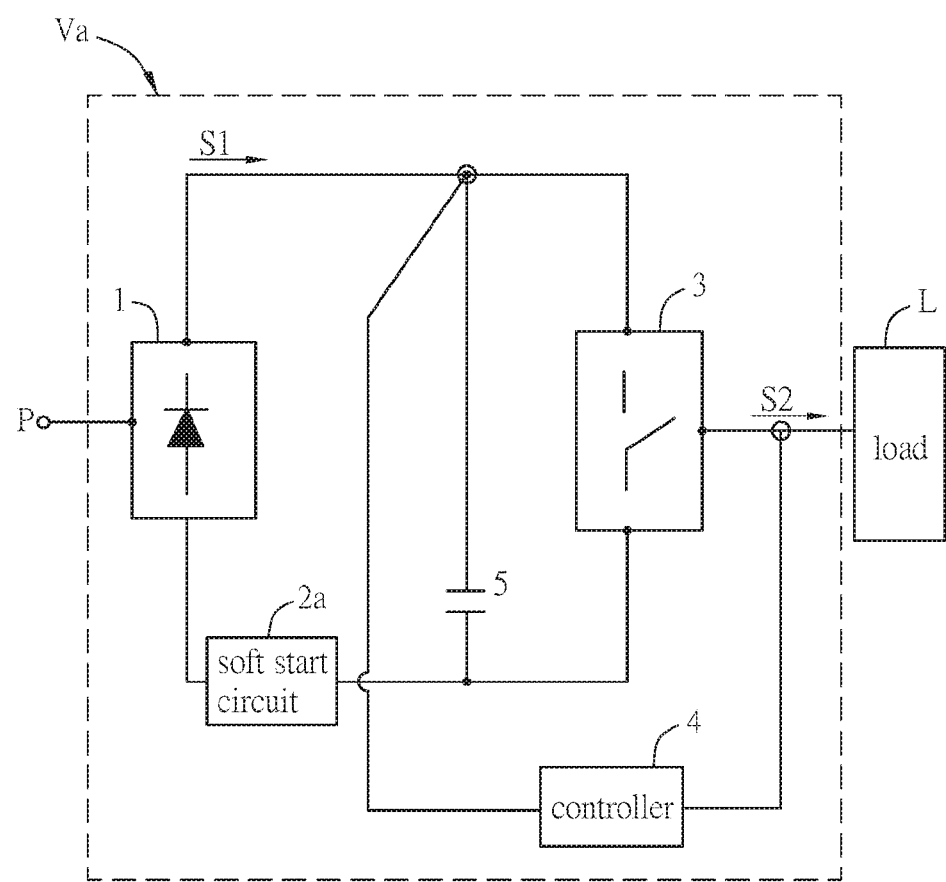
FIG. 5 is a schematic circuit diagram showing the variable frequency device according to another embodiment of the invention.

Referring to FIG. 5, FIG. 5 is a schematic circuit diagram showing the variable frequency device according to another embodiment of the invention. The variable frequency device Va in the embodiment is similar to the variable frequency device V in the previous embodiment. The difference is that the soft start circuit 2a in the embodiment is located at the low voltage side, that one in the previous embodiment is located at the high voltage side. Because other operations and determinations are similar or the same, they are not repeated here.

As mentioned above, benefited from the detection and computation by the controller, it is possible to determine whether the soft start circuit fails and the variable frequency device V can accordingly stop operating so as to prevent the resistor from burnout due to overly high temperature even fire outbreak. Besides, in the embodiment, it is no necessary to install additional components on the variable frequency device but whether the soft start circuit fails still can be detected. Thus, no additional expense will be added into the product cost and product protection is enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for detecting failure of soft start applied to a variable frequency device having an energy storage unit, an inverter circuit and a controller, the method comprising:
   connecting the variable frequency device to a load;
   detecting the energy storage unit at a first voltage level by the controller;
   generating an output current to the load by the inverter circuit;
   detecting the energy storage unit changed from the first voltage level into a second voltage level by the controller;

generating a reference voltage value according to the output current and determining whether a voltage difference value between the first voltage level and the second voltage level is larger than the reference voltage value by the controller;

determining whether a voltage peak-to-peak value of the energy storage unit is smaller than a set value by the controller if the voltage difference value is larger than the reference voltage value; and controlling the inverter circuit by the controller to stop outputting the output current to the load if the voltage peak-to-peak value is smaller than the set value.

2. The method of claim 1, wherein the reference voltage value is generated according to the output current and the resistance of a soft start circuit of the variable frequency device.

3. A variable frequency device, comprising:

a conversion circuit, receiving a power signal to accordingly output a DC signal;

a soft start circuit, receiving the DC signal;

an energy storage unit, electrically connected to the soft start circuit, wherein the DC signal charges the energy storage unit to a first voltage level through the soft start circuit;

an inverter circuit, electrically connected to the soft start circuit and the energy storage unit; and a controller, controlling the inverter circuit to output an output current;

wherein when the inverter circuit generates the output current to a load, the energy storage unit is changed from the first voltage level into a second voltage level, the controller generates a reference voltage value according to the output current and determines whether a voltage difference value between the first voltage level and the second voltage level is larger than the reference voltage value;

wherein if the voltage difference value is larger than the reference voltage value, the controller determines whether a voltage peak-to-peak value of the energy storage unit is smaller than a set value;

wherein if the voltage peak-to-peak value is smaller than the set value, the inverter circuit stops outputting the output current to the load.

4. The variable frequency device of claim 3, wherein the power signal is a DC power signal or an AC power signal.

5. The variable frequency device of claim 3, wherein the conversion circuit is a bridge rectifier or a three-phase rectifier.

6. The variable frequency device of claim 3, wherein the soft start circuit comprises a resistor and a relay, one terminal of the resistor is electrically connected to both the one terminal of the relay and the conversion circuit, and the other terminal of the resistor is electrically connected to both the other terminal of the relay and the energy storage unit.

7. The variable frequency device of claim 3, wherein the soft start circuit comprises a resistor and a thyristor, one terminal of the resister is electrically connected to both one terminal of the thyristor and the conversion circuit, and the other terminal of the resistor is electrically connected to both the other terminal of the thyristor and the energy storage unit.

8. The variable frequency device of claim 3, wherein the energy storage unit comprises at least one capacitor.

9. The variable frequency device of claim 3, wherein the inverter circuit is a half-bridge inverter, a full-bridge inverter or a three-phase inverter.

\* \* \* \* \*